United States Patent [19]

Kuhara et al.

[11] Patent Number: 5,722,409
[45] Date of Patent: Mar. 3, 1998

[54] NUCLEAR MAGNETIC RESONANCE IMAGING WITH PROTECTION AGAINST ARTIFACTS

[75] Inventors: Shigehide Kuhara; Kozo Sato, both of Kanagawa-ken; Shoichi Kanayama, Saitama-ken, all of Japan

[73] Assignee: Kabushiki Kaisha Toshiba, Kawasaki, Japan

[21] Appl. No.: 588,681

[22] Filed: Jan. 19, 1996

Related U.S. Application Data

[62] Division of Ser. No. 212,145, Mar. 14, 1994, Pat. No. 5,497,773.

[30] Foreign Application Priority Data

Mar. 12, 1993 [JP] Japan ................... 5-051832

[51] Int. Cl.⁶ .................................................. A61B 5/055
[52] U.S. Cl. .......................... 128/653.2; 128/653.3; 324/306; 324/307; 324/309
[58] Field of Search ........................ 128/653.2, 653.3; 324/306, 307, 309

[56] References Cited

U.S. PATENT DOCUMENTS 5,034,694  7/1991  Sattin et al. .................. 324/309
5,277,182  1/1994  Koizumi et al. ............... 128/653.3
5,394,872  3/1995  Takiguchi et al. ............. 128/653.2

Primary Examiner—Ruth S. Smith
Attorney, Agent, or Firm—Foley & Lardner

[57] ABSTRACT

A nuclear magnetic resonance imaging scheme capable of reducing the eddy currents induced within the living body outside of the imaging region, so as to protect the patient against the nerve stimulation due to the eddy currents, and obtaining the MR images at high image quality by protecting the image quality against the N/2 and chemical artifacts. The nerve stimulation is prevented by providing a shield member for shielding a nerve stimulation sensitive portion of the patient located outside of the imaging region from a change of the gradient magnetic fields. The artifacts are prevented by applying a reading gradient magnetic field which is repeatedly switching its polarity along a phase encoding gradient magnetic field applied at a rate of once in every two switchings of the reading gradient magnetic field, separating the acquired NMR signals resulting from odd and even turns of switchings of the reading gradient magnetic field as separate data sets, and re-constructing MR images from the separate data set for odd turns and even turns separately.

10 Claims, 17 Drawing Sheets

$$\frac{dB}{dt} = \frac{B_{max}}{t_r}$$

$$\frac{dB}{dt} = 2\pi f \times B_{max}$$

SCAN NO.

1ST EXCITATION | 2ND EXCITATION

NUCLEAR MAGNETIC RESONANCE IMAGING WITH PROTECTION AGAINST ARTIFACTS

This application is a division of application Ser. No. 08/212,145, filed Mar. 14, 1994, now U.S. Pat. No. 5,497,773.

BACKGROUND OF THE INVENTION

1. Field of the Invention

The present invention relates to a nuclear magnetic resonance imaging scheme for obtaining medical diagnostic data by measuring the density distribution of specific nuclei within a living body non-invasively by utilizing the nuclear magnetic resonance phenomenon.

2. Description of the Background Art

As already well known, the nuclear magnetic resonance imaging method (abbreviated hereafter as MRI) is a method for obtaining the microscopic physical and chemical data of the molecules by utilizing the nuclear magnetic resonance phenomenon in which, when the nuclei having the characteristic spin and magnetic moment associated with it are placed in a uniform static magnetic field of the strength $H\phi$, the nuclei resonantly absorb the radio frequency magnetic field which is rotating at the angular speed of $\omega\phi = \gamma H\phi$, where $\gamma$ is a gyromagnetic ratio which is a characteristic constant for a specific nucleus type on a plane perpendicular to the direction of the static magnetic field.

In this nuclear magnetic resonance imaging method, there are several known schemes for imaging the spatial distribution of the specific nuclei within the living body to be examined, such as hydrogen nuclei in the water and the fat for example, including the zeugmatography scheme of Lauterbur, the Fourier scheme of Kumar, Welti, Ernst, et al., and the spin warp scheme of Hutchinson which can be considered as the modification of the Fourier scheme. In addition, there are several known schemes for carrying out the image re-construction at high speed, including the high speed Fourier scheme and the echo planar scheme of Mansfield.

Now, in general, when the magnetic field B changes in time, its rate of change dB/dt induces the eddy currents within the living body placed in that changing magnetic field. In this regard, in the ultra high speed imaging schemes mentioned above the stronger than usual reading gradient magnetic field is applied repeatedly while switching, i.e., inverting its polarity, at high speed, so that the eddy currents can be induced in the living body under the examination using the ultra high speed imaging scheme. The typical exemplary waveforms of the gradient magnetic fields B used in the ultra high speed imaging schemes are shown in FIGS. 1A and 1B, along with their corresponding dB/dt waveform, where FIG. 1A is the trapezoidal gradient magnetic field and FIG. 1B is the sinusoidal gradient magnetic field.

In particular, in a case of using the gradual magnetic field which is both strong as well as switching at high speed as in the ultra high speed imaging scheme, the induced eddy current density can exceed the minimum stimulation level of the nerve of the living body, and can be sensed by the living body as the nerve stimulation. Here, the induced eddy current density J (A/m²) can be expressed by the following equation (1):

$$J = \sigma \cdot r/2 \cdot dB/dt \qquad (1)$$

where r (m) is a radius of the induced eddy current flow, and $\sigma$ (sec/m) is a conductivity of the living body. This expression has been disclosed in T. F. Budinger et al., "Health Effects of in Vivo Nuclear Magnetic Resonance", Biomedical Magnetic Resonance (T. L. James et al. editors).

Is this regard, there are reports indicating that the nerve stimulation can be caused by the current density in a range of J=1 to 4 (A/m²), so that when the field change dB/dt is capable of causing the induced eddy current density in this range, the nerve stimulation can be caused in the living body. (See: D. McRobbie, et at., Clinical Physics for Physiological Measurement, Vol. 5, p. 67, 1984; and H. Yamagata et al., "Evaluation of dB/dt Thresholds for Nerve Stimulation Elicited by Trapezoidal and Sinusoidal Gradient Fields in Echo-Planar Imaging" in "Proceedings of 10th Annual Meeting of Magnetic Resonance in Medicine. Works in Progress, San Francisco, 1991", p. 1277.)

In further detail, the actual field change dB/dt generated in the MRI will be explained with reference to FIG. 2. Namely, the gradient magnetic field Gx normally used for the imaging in the MRI causes a magnetic field component xGx in the Z direction as shown in FIG. 2. On the other hand, according to the electromagnetic field theory of Maxwell, it is known that there exists a cross magnetic field component zGx in the X direction perpendicular to the gradient magnetic field Gx. In this case, as the patient's body is lying along the Z direction, the patient's body extends farther in the Z direction than in the X direction, so that the cross magnetic field component zGx on the patient's body is larger than the magnetic field component xGx on the patient's body.

Consequently, the possibility of causing the nerve stimulation is greater for the cross magnetic field component zGx than the magnetic field component xGx. In other words, when the gradient magnetic field is centered at the chest portion in order to image the chest portion, the nerve stimulation is more likely caused at the head portion and the waist portion which are farther distanced from the center of the gradient magnetic field.

Moreover, the eddy currents become greater for the larger radius r as can be seen in the above equation (1), so that even for the same field change dB/dt, the eddy current density J becomes greater at the portion at which the eddy current flow radius r is relatively larger, i.e., the cross sectional area through which the eddy currents are flowing is larger. Consequently, in the imaging of the chest portion, the nerve stimulation is more likely caused at the head portion or the waist portion which has the larger cross sectional area.

In fact, there is a report that when the sinusoidal gradient magnetic field is used as Gx, the nerve stimulation has been sensed at the middle of the forehead for dE/dr=61 Tesla/sec. (See, M. S. Cohen, et al., "Sensory Stimulation by Time-varying Magnetic Fields", Magnetic Resonance in Medicine, Vol. 114, No. 3, pp. 409–414, 1990.)

Thus, in the conventional MRI apparatus, there has been a problem of the occurrence of the nerve stimulation due to the eddy currents, particularly at the head and waist portions, which can be at least uncomfortable for the patient even if it is not painful.

On the other hand, the ultra high speed imaging scheme has the advantage of the short imaging time as well as the disadvantage that a high resolution is difficult to obtain in the one shot type operation due to the limitations on the hardware. To remedy this disadvantage, there has been a proposition for division scan scheme in which one frame of the image is obtained by a plurality of scans, by sacrificing the imaging time somewhat.

However, such ultra high speed imagine scheme and division scan scheme still basically require the reading gradient magnetic field to be switched at high speed, so that the influence of the magnetic field inhomogeneity appears oppositely at the even turns and the odd turns. Consequently, when the NMR signals acquired by these schemes are reconstructed straightforwardly, the artifact called N/2 artifact in which the ghost appears at positions distanced by a half of a size of the imaging region from the actual image can be produced on the re-constructed MR image, to degrade the image quality considerably.

In order to avoid this N/2 artifact, it has conventionally been necessary to carry out a complicated procedure for measuring and correcting the homogeneity of the static magnetic field.

In addition, in case a moving object such as the blood is present in the imaging region, it has been possible in the ordinary conventional imaging schemes to suppress the artifact due to the motion of the moving object by carrying out the phase re-focusing, i.e., the addition of the phase compensation gradient magnetic fields, in three directions into which the gradient magnetic fields are applied. However, in a case of the ultra high speed imaging scheme or division scan scheme, the reading gradient magnetic field switching at high speed is used, so that the phase shift component due to the motion speed cannot be set equal to zero for both the even turns and the odd turns, so that it has been difficult to suppress the artifact due to the motion in the gradient magnetic field direction.

Moreover, in the ultra high speed imaging scheme and the division scan scheme, the phase encoding gradient magnetic field is much weaker than the reading gradient magnetic field, so that there has been a problem that the so called chemical artifact in which the fat component is displaced in the phase encoding direction can be produced on the re-constructed MR image.

SUMMARY OF THE INVENTION

It is therefore an object of the present invention to provide a nuclear magnetic resonance imaging scheme capable of reducing the eddy currents induced within the living body outside of the imaging region, so as to protect the patient against the nerve stimulation due to the eddy currents.

It is another object of the present invention to provide a nuclear magnetic resonance imaging scheme capable of obtaining the MR images at high image quality by protecting the image quality against the N/E and chemical artifacts, without requiring a complicated procedure.

According to one aspect of the present invention there is provided an apparatus for nuclear magnetic resonance imaging, comprising: MRI means for taking an MR image of an imaging region within a patient placed in a static magnetic field, by applying gradient magnetic fields and RF pulses according to a prescribed pulse sequence onto the patient, and acquiring NMR signals from the patient; and a shield member for shielding a nerve stimulation sensitive portion of the patient located outside of the imaging region from a change of the gradient magnetic fields applied by the means.

According to another aspect of the present invention there is provided a method of nuclear magnetic resonance imaging, comprising the steps of: exciting spins in an imaging region within the patient placed in a static magnetic field by applying prescribed gradient magnetic fields and RF pulses onto the patient; applying a reading gradient magnetic field which is repeatedly switching its polarity, along a phase encoding gradient magnetic field applied at a rate of once in every two switchings of the reading gradient magnetic field; acquiring NMR signals from the patient resulting from the reading gradient magnetic field applied at the applying step, and separating the NMR signals resulting from odd and even turns of switchings of the reading gradient magnetic field as data set for odd turns and data set for even turns; and re-constructing one MR image from the data set for odd turns alone, and another MR image from the data set for even turns alone.

Other features and advantages of the present invention will become apparent from the following description taken in conjunction with the accompanying drawings.

DETAILED DESCRIPTION OF THE PREFERRED EMBODIMENTS

Now, the first embodiment of a nuclear magnetic resonance imaging scheme according to the present application will be described in detail.

Figure 1A:
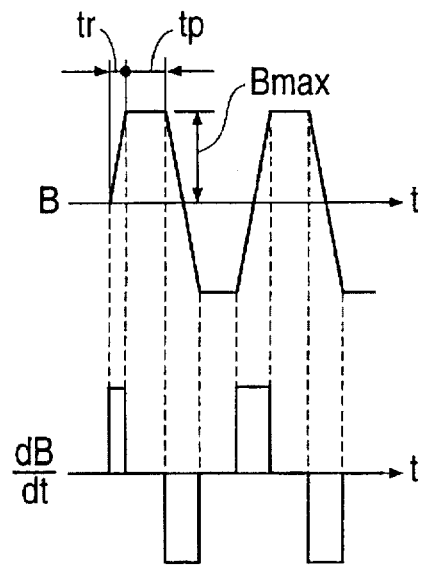
FIGS. 1A and 1B are diagrams of two examples of gradient magnetic field waveform and dB/dt waveform used in the ultra high speed imaging scheme.
Figure 1B:
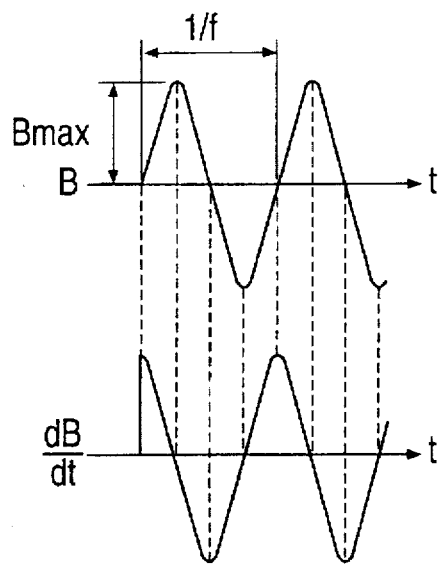
Figure 2:
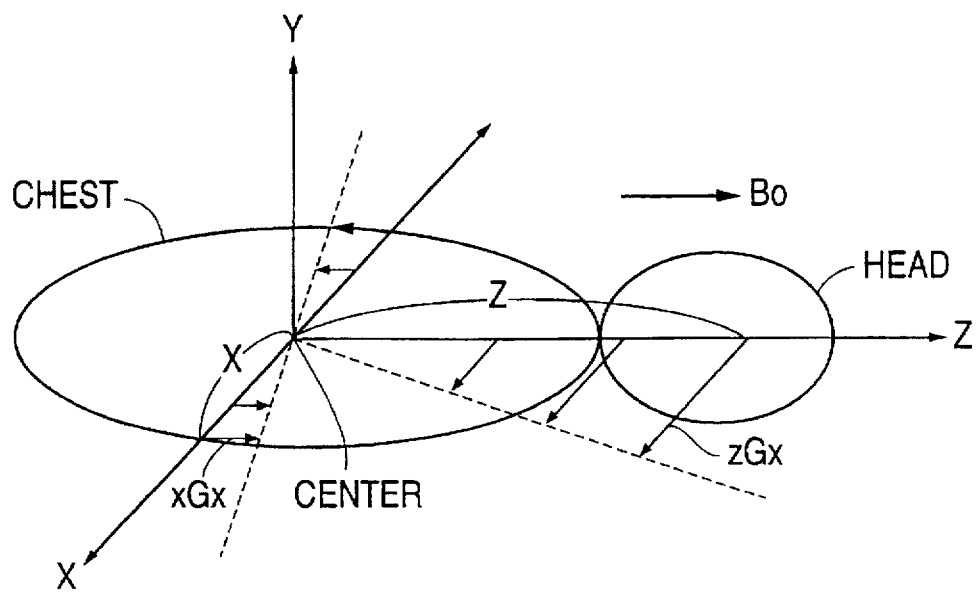
FIG. 2 is a diagram for explaining a mechanism for causing the nerve stimulation.
Figure 3A:
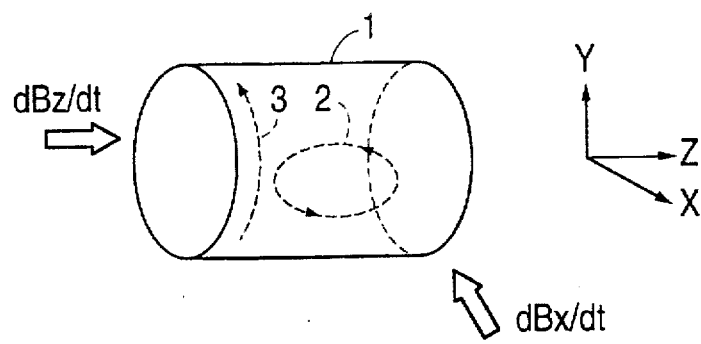
FIG. 3A is a schematic illustration of a shield member used in the nuclear magnetic resonance imaging scheme of the first embodiment according to the present invention.

In this first embodiment, there is provided a cylindrical shield member 1 made of a conductive material for covering a desired portion of the patient at which the occurrence of the nerve stimulation is desired to be prevented. When this shield member 1 is placed in the gradient magnetic fields, as shown in FIG. 3A, eddy currents 2 and 8 can be induced by the changes of the gradient magnetic fields dBx/dt and dBz/dt, respectively, in the directions to oppose these field changes dBx/dt and dBz/dt. As a result, the field change dB/dt within the shield member 1 can be reduced by the opposing magnetic fields produced by the eddy currents induced on the shield member 1 such that the induced eddy current density within the living body can be reduced below the minimum level for causing the recognizable nerve stimulation.

Figure 3B:
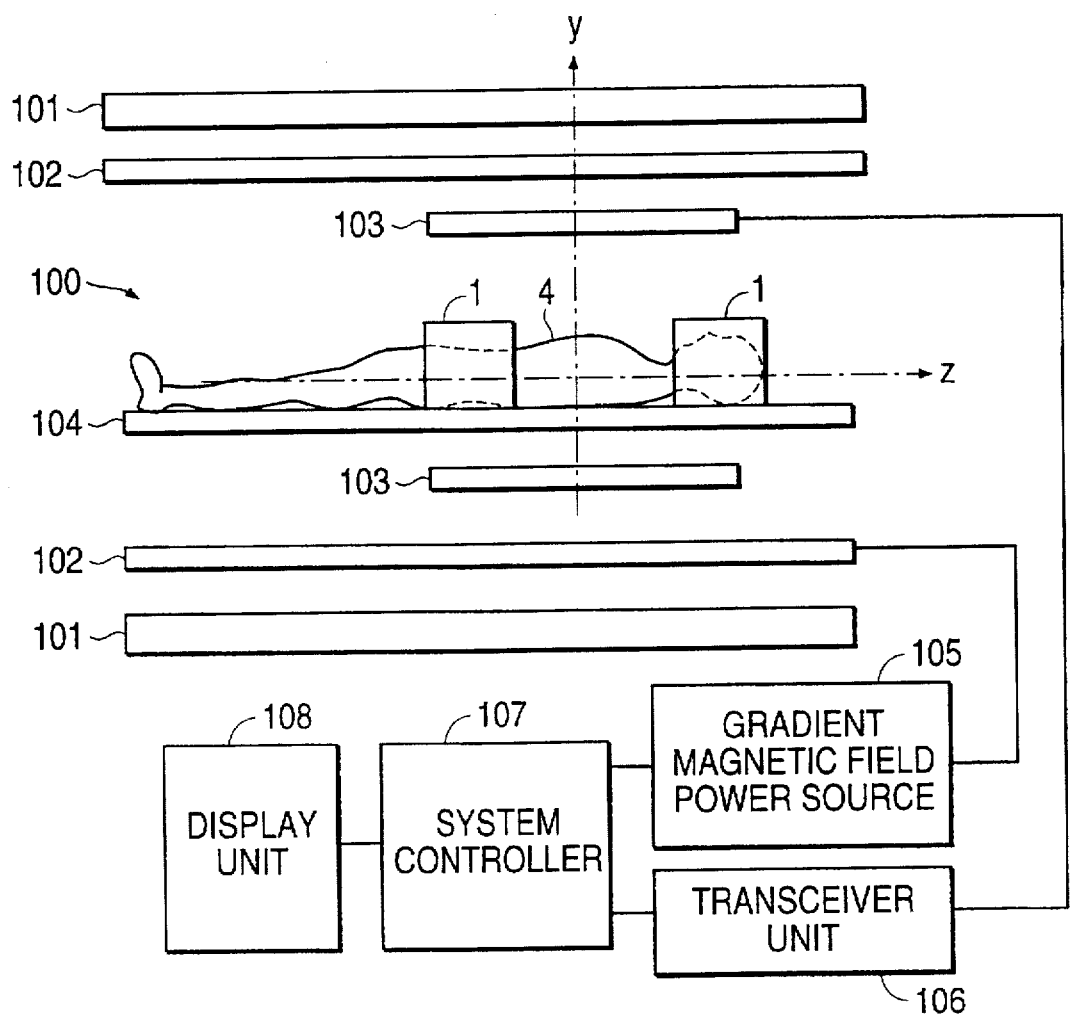
FIG. 3B is a schematic diagram of an MRI apparatus used in the first embodiment showing an exemplary state in which the shield member of FIG. 8A is attached to the patient.

In a case of preventing the occurrence of the nerve stimulation at the head and waist portions during the imaging of the chest portion, for example, the shield member 1 can be provided to cover each of the head and waist portions of the patient 4 as shown in FIG. 3B, where the patient 4 is placed on a treatment table 104 within an MRI gantry 100 in which the static magnetic field is generated by a main magnet 101, the gradient magnetic fields are generated by gradient magnetic field coils 102 driven by a gradient magnetic field power source 105, and the RF pulses are applied to the patient 4 and the NMR signals from the patient 4 are received by a probe coil 103 driven by a transceiver unit 108. The gradient magnetic field power source 105 and the transceiver unit 106 are controlled by a system controller 107 containing usual sequence controller and data processing unit such that the desired imaging pulse sequence is executed and the MR image re-constructed from the acquired NMR signals can be displayed on a display unit 108.

Now, as already described above, the induced eddy current density J $(A/m^2)$ can be expressed by the above equation (1), and the minimum induced eddy current density for causing the nerve stimulation is in a range of J=1 to 4 $(A/m^2)$, so that in principle it suffices to design the shield member 1 to have a shielding effect to realize the field change dB/dt in a covered area for which the induced eddy current density becomes below this range.

Figure 4:
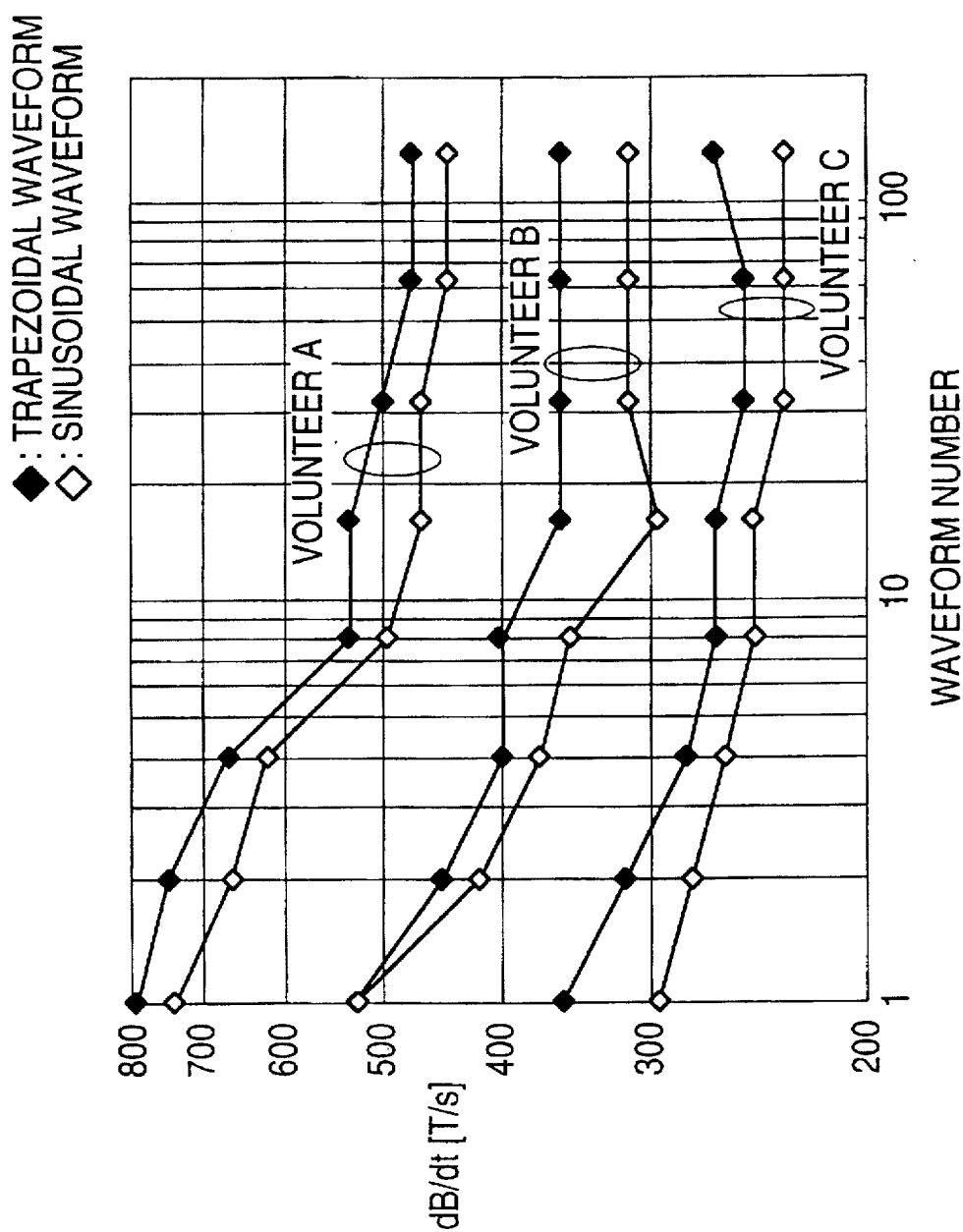
FIG. 4 is a graph indicating the individual variations of the minimum field change dB/dt for causing the nerve stimulation as a function of a number of waveforms.

However, as indicated in FIG. 4, the minimum field change dB/dt for causing the nerve stimulation varies considerably for different individuals, so that if the minimum field change dB/dt is to be set up in advance universally, there is a need to set it at a quite low value in order to provide a sufficient margin, and this very low setting can be a severe limitation in practice.

For this reason, the actual minimum nerve stimulation level of each patient may be measured prior to the actual imaging by the MRI, by means of a compact coil for generating the magnetic field to cause the localized nerve stimulation intentionally for the measurement purpose, and then the shielding effect of the shield member 1 can be set up in accordance with the measured minimum nerve stimulation level of each patient. Here, the shielding effect of the shield member 1 can be changed by changing a selection of the shield member 1 itself from a set of shield members with different shielding effects which are prepared and provided in advance.

Figure 5A:
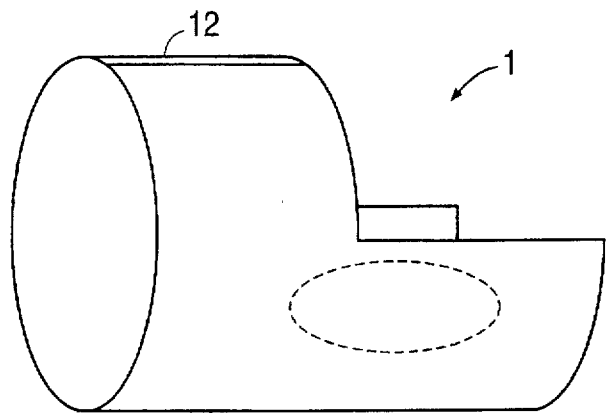
FIG. 5A is a perspective view of one practical configuration of the shield member of the first embodiment.
Figure 5B:
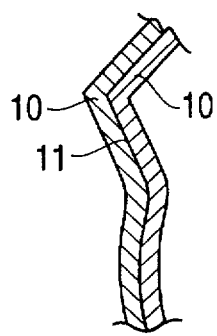
FIG. 5B is an enlarged view of an inner structure of a main body in the configuration of FIG. 5A.

In practice, the shield member 1 of this first embodiment can be formed in an overall shape as shown in FIG. 5A in a case of covering the head portion. Here, as shown in FIG. 5B, a main body of the shield member 1 is made as a flexible body formed by a shielding sheet 11 made of copper foil, aluminum sheet, etc., which is sandwiched between conductive covers 10 made of a conductive material such as vinyl, polyester, etc.

Figure 5C:
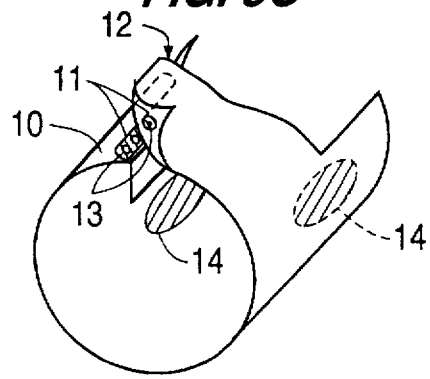
FIG. 5C is a perspective view of the shield member of FIG. 5A, showing an attachment portion in detail.

Also, as shown in FIG. 5C, this shield member 1 has an attachment portion 12 which is made to be freely openable, such that the patient's head can be placed over this shield member 1 in an opened state, and then the shield member 1 can be wound around the patient's head by attaching two free ends together at the attachment portion 12 over the patient's forehead. Here, at the attachment portion 12, the covers 10 of the free ends are partially torn at mutually facing positions to expose the shielding sheet 11, such that the shielding sheet 11 itself can form a closed loop when the free ends are attached together. The attachment of the free ends is facilitated by means of snaps 13 or freely openable attachment tapes (not shown) provided on the free ends.

In addition, this shield member 1 has ear pads 14 provided on an inner side for covering the ears of the patient when the shield member 1 is wound around the patient's head. These ear pads 14 are made from sound absorbing material covered by soft vinyl, and provided for the purpose of protecting the patient's ears in view of the fact that the noises produced in the ultra high speed imaging scheme is 20–30 dB higher than the usual imaging scheme.

Figure 6:
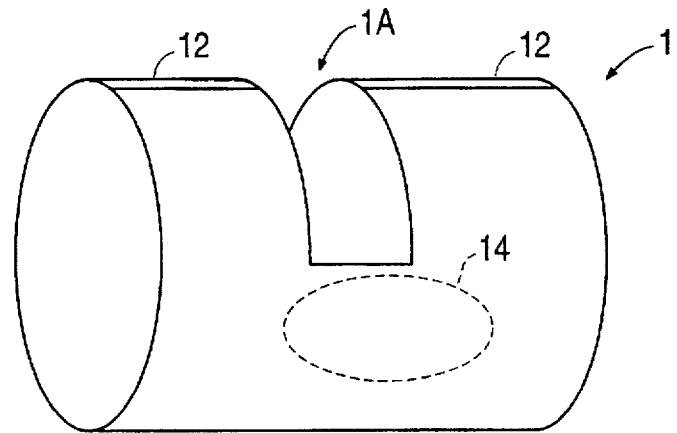
FIG. 6 is a perspective view of an alternative configuration for the shield member of FIG. 5A.

Alternatively, the overall shape of the shield member 1 may be modified as shown in FIG. 6, in which a cylindrical main body is provided with a window section 1A to be located over the patient's eyes when the shielding member 1 is wounded around the patient's head, so as to cover substantially the entire head portion of the patient. Here, the size of the window section 1A can be made larger if desired, and a cut or a hole to be located over the patient's nose may also be provided in addition.

Figure 7A:
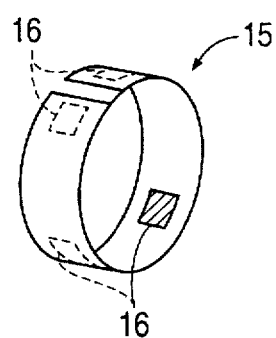
FIG. 7A is a perspective view of another practical configuration of the shield member of the first embodiment.
Figure 7B:
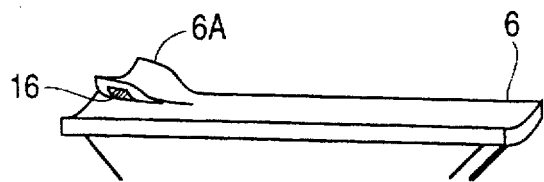
FIG. 7B is a perspective view of a treatment table to be used in conjunction with the shield member of FIG. 7A.
Figure 7C:
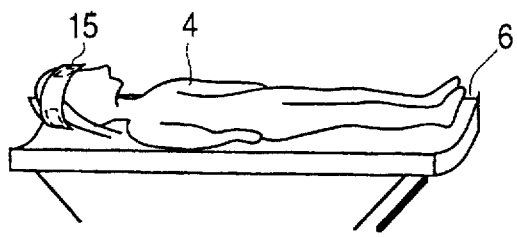
FIG. 7C is a side view of an exemplary state in which the shield member of FIG. 7A is attached to the patient.

It is also possible to form the shield member of this first embodiment in a form of a head band 15 as shown in FIG. 7A, which can be freely attached or detached from the patient's head. This head band 15 has freely openable attachment tapes provided at two free ends and to be attached together. In addition, this head band 15 has additional freely openable attachment tapes 16 at positions corresponding to the back side of the patient's head, which are to be attached together with freely openable attachment tapes 16 provided on a back side of a head rest 6A on the treatment table 6 as shown in FIG. 7B, such that the head band 15 can be attached to the patient 4 lying on the treatment table 6 in a state shown in FIG. 7C.

Here, the head band 15 itself has a flexible structure similar to that shown in FIG. 5B, while the freely openable attachment tapes 16 on the head band 15 made to be conductive, such that the head band 15 itself can form a closed loop when the free ends are attached together. In addition, the shielding sheet similar to that provided in the head band 15 is also embedded within the head rest 6A of the treatment table 6 and the freely openable attachment tapes 16 on the head rest 6A are also made to be conductive, such that the head rest 6A itself can function as a part of the shield member when the head band 15 is attached to the head rest 6A.

Figure 8A:
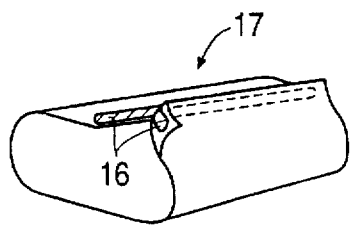
FIG. 8A is a perspective view of another practical configuration of the shield member of the first embodiment.
Figure 8B:
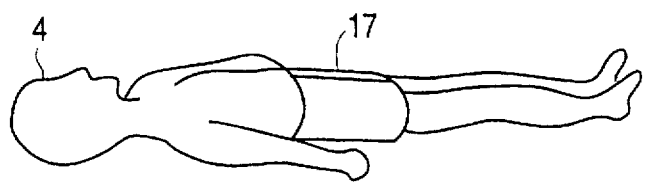
FIG. 8B is a perspective view of an exemplary state in which the shield member of FIG. 8A is attached to the patient.

On the other hand, in a case of covering the waist portion, it is also possible to form the shield member of this first embodiment in a form of a waist band 17 as shown in FIG. 8A, which has the similar structure as the head band 15 described above, except for its size which is adapted to the patient's waist. This waist band 17 can be attached to the patient 4 lying on the treatment table 6 in a state shown in FIG. 8B.

It is also possible to modify this waist band in a form of a trousers such that it can be attached to the patient in a manner of wearing the trousers.

Figure 9:
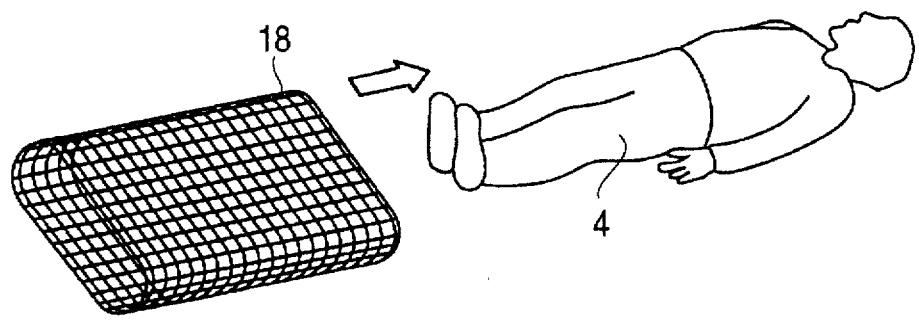
FIG. 9 is a perspective view of an alternative configuration for the shield member of FIG. 8A.

Here, it is also possible to form the shield member for covering the waist portion in a form of a mesh band 18 as shown in FIG. 9 to provide an additional flexibility. In this case, the mesh band 18 can be made from a metal plated fabric material.

Now, because of the high cost required for the gradient magnetic field power source capable of handling the ultra high speed imaging scheme, the use of the ultra high speed imaging scheme is often adopted for only one channel, and in such a case the gradient magnetic field which can cause the nerve stimulation can be limited to only one, so that the direction in which the nerve stimulation can be caused can also be limited to that one direction.

Figure 10:
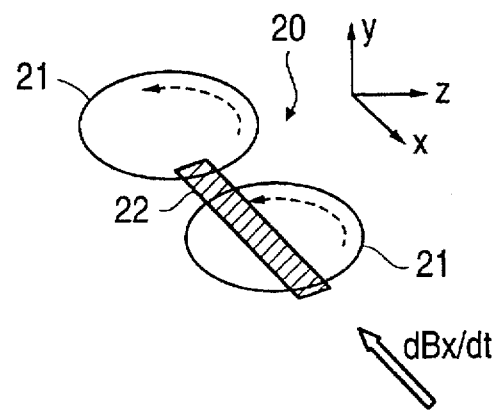
FIG. 10 is a perspective view of a simplified configuration using single turn coils for the shield member of the first embodiment.

In such a case, it is also possible to form the shield member of this first embodiment by a single turn coil having a shielding effect in only one direction. For example, the shield member can be formed in a simplified headset 20 using single turn coils as shown in FIG. 10, in which a pair of single turn coils 21 are attached at ends of a coil support member 22. Here, each single turn coil 21 forms a closed loop by itself, and this closed loop is oriented such that a plane containing this closed loop is perpendicular to the direction of the field change which can cause the nerve stimulation.

Figure 11:
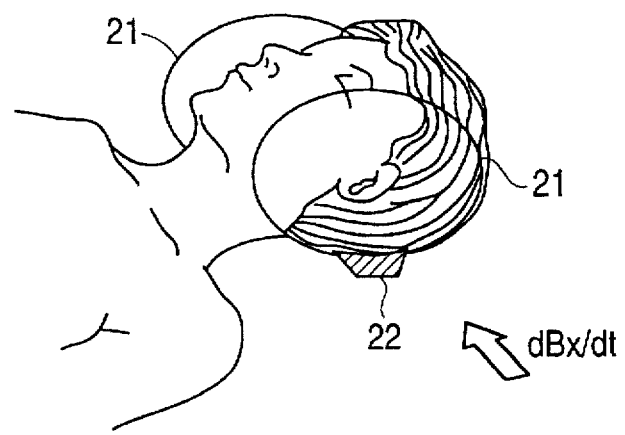
FIG. 11 is a perspective view of an exemplary state in which the shield member of FIG. 10 is attached to the patient.

FIG. 10 depicts an exemplary case in which the gradient magnetic field Gx in the x-direction causes the nerve stimulation, in which case the single turn coils 21 are to be oriented along the y-z plane perpendicular to the x-direction of the field change dBx/dt. This headset 20 is used by placing the patient's head between the single turn coils 21, over the coil support member 22, as shown in FIG. 11.

Figure 12A:
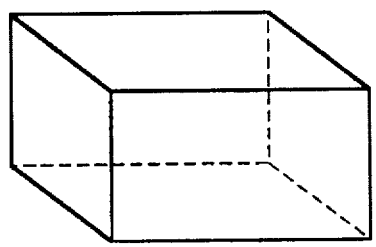
FIGS. 12A, 12B, 12C, 12D, 12E, and 12F are schematic illustrations of various modified configurations for the single turn coils that can be used in the shield member of FIG. 10.
Figure 12B:
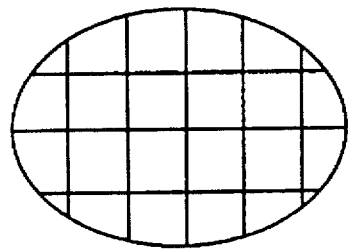
Figure 12C:
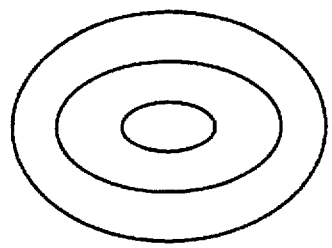
Figure 12D:
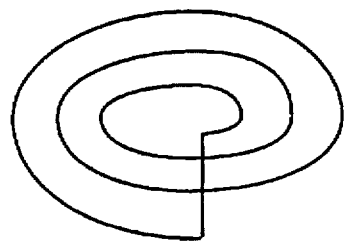
Figure 12E:
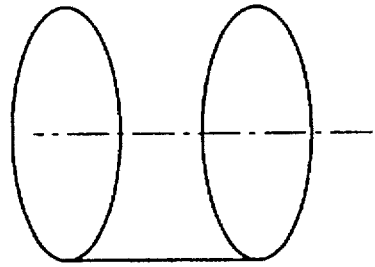
Figure 12F:
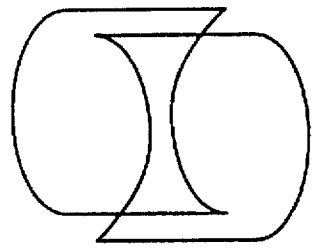

Here, the single turn coil may be modified in various forms as shown in FIGS. 12A to 12F. Namely, FIGS. 12A shows a case in which rectangular single turn coils are combined together to form a cubic shape, so as to make it possible to cope with nerve stimulation in three orthogonal directions. FIG. 12B shows a case of incorporating a mesh shaped shield member within the single turn coil to increase the shielding effect. It is also possible to replace the mesh shaded member by a plate shaped shield member, if desired. FIG. 12C shows a case in which a number of single turn coils with different radius are arranged coaxially to increase the shielding effect, while FIG. 12D shows a case in which a number of turns in each coil is increased by forming each coil in a spiral shape to increase the shielding effect. It is also possible to increase the shielding effect by increasing a number of tunes at the same radius, if desired. FIG. 12E shows a case in which two single turn coils are joined together to form a single closed loop, while FIG. 12F shows a case in which a pair of single turn coils are formed in shapes of a saddle coils.

It is also possible to employ any other desired shape for each single turn coil for a purpose of improving a fitting with respect to the portion of the patient's body to which it is intended to be used. Moreover, there is no need to use the single turn coils in pair as in a case of FIG. 10 described above, and just one single turn coil may be used as long as the sufficient shielding effect can be obtained.

It is to be noted that the outer diameter of the closed loop should preferably have an approximately the same size as that of the cross section of the portion of the patient to be protected.

It is to be noted here that the shield member of this first embodiment is effectively used at the portions rather separated from the imaging region, such as the head and waist portion in a case of imaging the chest portion, so that it can be safely assumed that the opposing magnetic fields produced in the shield member of this first embodiment are not going to affect the imaging operation of the MRI for most cases.

However, in a case of using an imaging sequence which is particularly sensitive to the presence of the eddy currents such as that for the phase contrast angiography, the use of the shield member of this first embodiment may have an unignorable effect on the imaging operation of the MRI. In such a case, it is still possible to reduce the effect of the use of the shield member of this first embodiment as much as possible as follows.

Namely, it is possible to shorten the time constant τ of the eddy currents induced on the shield member of this first embodiment such that the effect due to presence of the opposing magnetic fields does not last until the data acquisition period in the imaging operation of the MRI, i.e., the opposing magnetic fields produced by the induced eddy currents disappear at the data acquisition period in the imaging operation of the MRI. Here, the time constant τ can be expressed by the following equation (2):

$$\tau = \kappa \cdot \sigma \cdot t \qquad (2)$$

where κ is constant, σ is a conductivity, and t is a thickness of the conductive material in the shield member. Consequently, it is possible to shorten this time constant τ by making the conductive material to be either thinner in thickness, or lower in conductivity.

For example, in a case of an aluminum sheet made of "Al 5053" in a thickness of 3 mm has the conductivity σ=1.8× $10^5$ ($cm^{-1}$), so that the time constant τ is approximately 2.6 ms. This time constant value is too long for use in conjunction with the ultra high speed imaging scheme in which the required rise time of the gradient magnetic field is approximately 100 to 300 μs (zero to peak), so that there is a need to make it thinner. On the other hand, in a case of using "sus 316L" as the conductive material, as it has the conductivity σ=1.4×$10^4$ ($cm^{-1}$), so that with the thickness t=2 mm, the time constant τ of about 230 μs can be realized, and consequently it is suitable for use in conjunction with the ultra high speed imagine scheme. Similarly, in a case of using copper as the conductive material, although it has the conductivity in the same order as that of the aluminum sheet, it can be thinned to the thickness of 45 μm, so that the time constant τ of about 100 μs can be realized, and consequently it is also suitable for use in conjunction with the ultra high speed imaging scheme. Such a very thin conductive material can be provided on a support body of an acrylic cylinder.

Alternatively, it is also possible to cut the closed loop forcefully such that the effect due to presence of the opposing magnetic fields does not last until the data acquisition period in the imaging operation of the MRI.

Figure 13:
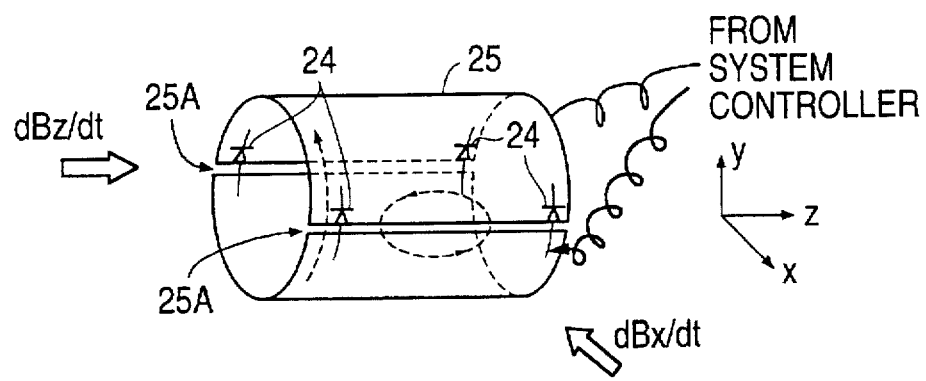
FIG. 13 is a perspective view of a modified configuration for the shield member of FIG. 3.
Figure 14:
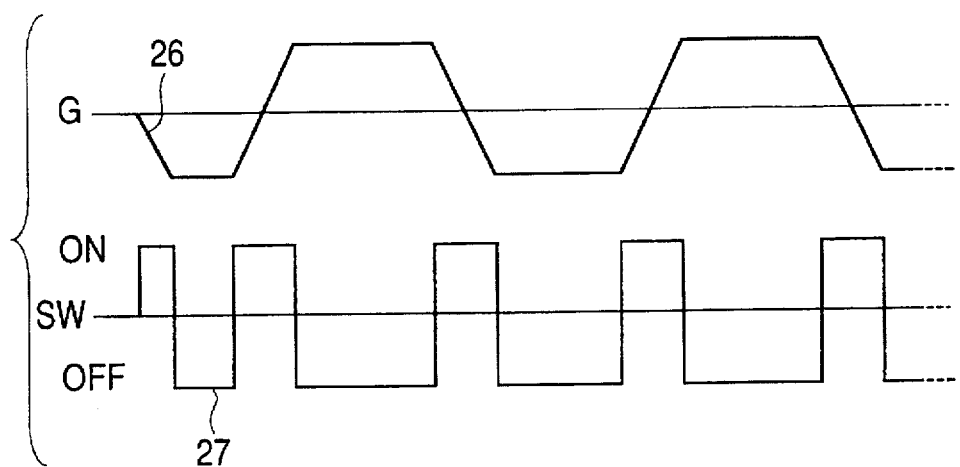
FIG. 14 is a timing chart for operating switches provided in the shield member of FIG. 13.

In this case, the shield member is formed in a configuration as shown in FIG. 13, in which a main body in a form of a conductive cylinder 25 is divided in half by slits 25A, and divided parts are connected together by PIN diode switches 24 which are normally in OFF state and controlled to be in ON state from the system controller, such that the conductive cylinder 25 has no or very little induced eddy currents thereon while the switches 24 are OFF, whereas a closed loop capable of obtaining the sufficient amount of eddy currents is formed when the switches 24 are ON. Then, the switches 24 are controlled according to the timing chart of FIG. 14 as follows. Namely, in relation to the gradient magnetic field G in the trapezoidal waveform as indicated, the switches 24 (SW) are turned ON only while the gradient magnetic field G is changing and OFF while the gradient magnetic field G stays at the same level, such that the eddy currents are induced to make the sufficient shielding effect only when the field change dB/dt is significant and the opposing magnetic fields disappear during the data acquisition period so as not to influence the imaging operation in the MRI.

Figure 15:
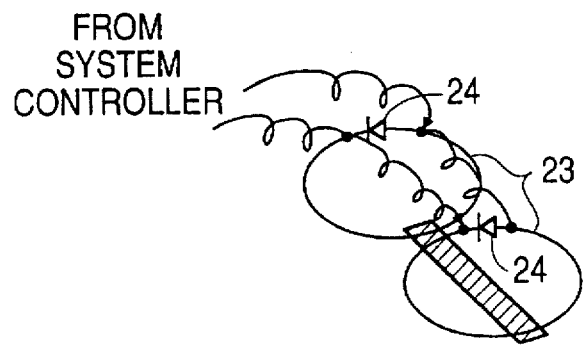
FIG. 15 is a perspective view of a modified configuration for the shield member of FIG. 10.

It is also possible to apply this scheme to the shield member using the single turn coils of FIG. 10 described above, by providing PIN diode switches 24 on single turn coils 28 as shown in FIG. 15. Here, it is possible to connect both of the single turn coils in series as indicated in FIG. 15, such that both of the PIN diode switches 24 can be controlled by the system controller simultaneously.

Furthermore, it is also possible to modify the shield member of this first embodiment into an active type rather than a passive type described above. Namely, in synchronization with the field change dB/dt, the currents can be supplied into coils to generate the opposing magnetic fields actively.

Figure 16:
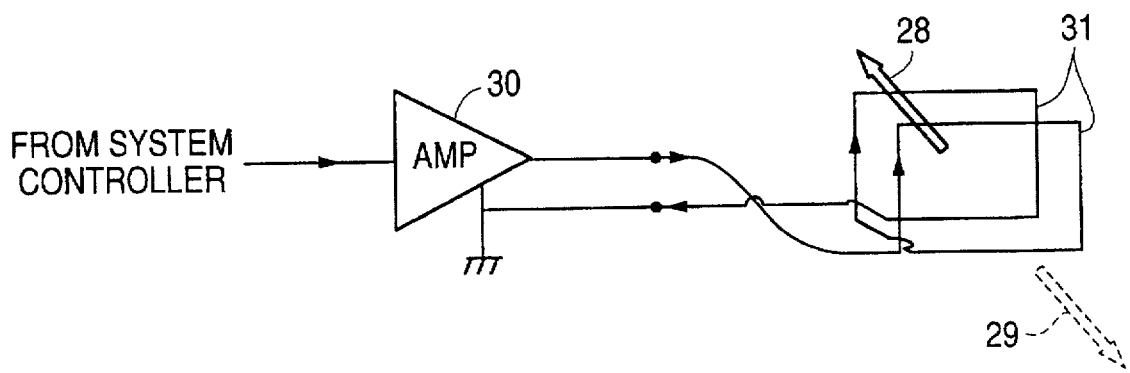
FIG. 16 is a schematic diagram for a modified configuration for the shield member of the first embodiment.
Figure 17:
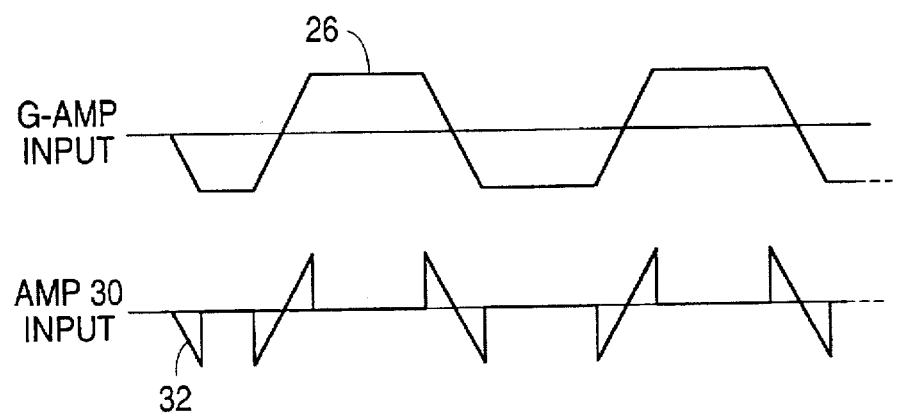
FIG. 17 is a timing chart for operating a driving amplifier used in the shield member of FIG. 16.

In this case, the shield member is formed in a configuration as shown in FIG. 16, in which a mutually connected pair of parallel rectangular coils S1 are driven by a driving amplifier so for amplifying control signals supplied from a system controller (not shown). Here, the parallel rectangular coils 31 are connected with the driving amplifier 30 such that the opposing magnetic field 28 for cancelling out the cross magnetic field 29 can be generated in response to the positive input at the driving amplifier 30, for example. Then, the input of the driving amplifier 30 is controlled according to the timing chart of FIG. 17 as follows. Namely, in relation to the gradient magnetic field amplifier (G-amp) input in the trapezoidal waveform as indicated, the input of the driving amplifier 30 is changed to follow the change of the gradient magnetic field only while the gradient magnetic field is changing, such that the opposing magnetic field 28 is generated to make the sufficient shielding effect only when the field change dB/dt is significant.

It is also possible to apply this scheme to the shield member using various modified configurations for the single turn coils as described above, as well as to the shield member using the conductive cylinder as described above. In such a case, however, only one slit or gap should be formed and the driving currents should be supplied from such a slit or gap.

Thus, according to this first embodiment, it becomes possible to provide a nuclear magnetic resonance imaging scheme capable of reducing the eddy currents induced within the living body outside of the imaging region, such that the the patient can be protected against the nerve stimulation due to the eddy currents even when the high speed switching gradient magnetic fields are used. Consequently, it becomes possible to execute the ultra high speed imaging scheme without making the patient to feel uncomfortable or uneasy because of the nerve stimulation.

Now, the second embodiment of a nuclear magnetic resonance imaging scheme according to the present application will be described in detail.

This second embodiment concerns with a modified division scan scheme which is carried out according to the timing chart of FIG. 18 as follows.

Figure 18:
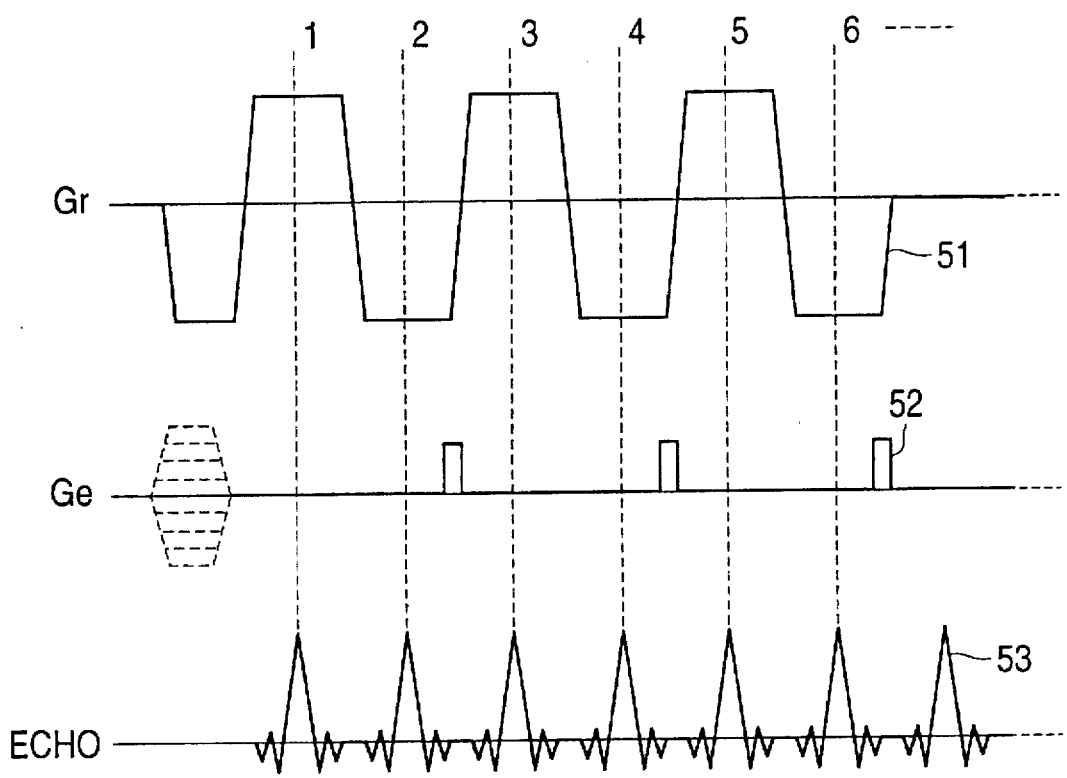
FIG. 18 is a timing chart for a data acquisition operation part of the pulse sequence for a modified division scan scheme of the second embodiment according to the present invention.

First, prior to the data acquisition operation according to the timing chart of FIG. 18, the spins in an imaging region within the patient placed in a static magnetic field are excited by applying prescribed gradient magnetic fields and RF pulses onto the patient.

Then, according to the timing chart of FIG. 18, in relation to a reading gradient magnetic field Gr 51 which is repeatedly switching its polarity at a high speed, a phase encoding gradient magnetic field Ge 52 is applied at a rate of once in every two switchings of the reading gradient magnetic field Gr 51.

This is in contrast to the conventional division scan scheme in which the phase encoding gradient magnetic field is applied at each switching of the reading gradient magnetic field. In such a conventional division scan scheme, as the reading gradient magnetic field is repeatedly inverting its polarity to be positive and negative alternately, the projection obtained by applying the one dimensional Fourier transformation on the acquired echo signal data is also going to be inverted alternately. Consequently, at a time of the image re-construction, the data obtained by either one of the odd turns or the even turns are inverted, while the data obtained by the other one of the odd turns or the even turns are used as they are.

However, in such a conventional division scan scheme, the data of odd turns and the even turns receive the position displacement due to the inhomogeneity of the static magnetic field differently. Namely, assuming that the reading gradient magnetic field has a positive polarity at the odd turns, a position x in the direction of the reading gradient magnetic field is going to be displaced to a displaced position x' expressed by the following equations (3) and (4):

$$x'=x+\Delta H(x, y)/Gx \text{ (Odd turns)} \quad (3)$$

$$x'=x-\Delta H(x, y)/Gx \text{ (Even turns)} \quad (4)$$

where ΔH(x, y) is the inhomogeneity of the static magnetic field, and Gx is the reading gradient magnetic field strength in the x direction.

Figure 19:
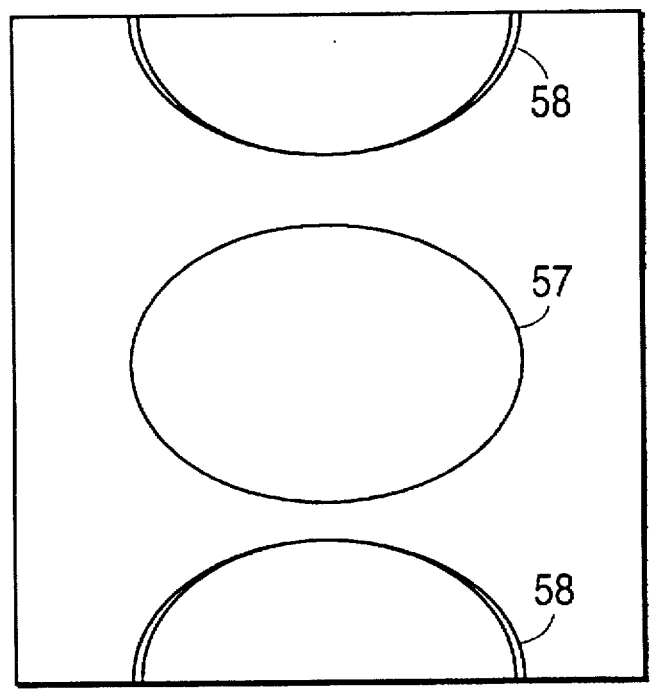
FIG. 19 is an illustration of the N/2 artifact that can be prevented by the modified division scan scheme of FIG. 18.

Consequently, the data of the odd turns and even turns receive the opposite influences from the inhomogeneity of the static magnetic field, so that when these data are used mixedly in the same K-space, the data on the K-space are going be discontinuous an each step in the phase encoding direction. Then, when the image is re-constructed from such discontinuous data, the undesirable N/2 artifact shown in FIG. 19 in which the ghost 58 appears at positions distanced by a half of a size of the imaging region from the actual image 57 is produced on the re-constructed image. Here, the ghost 58 primarily appears in a shape of the edge of the actual image 57.

In contrast, in the modified division scan scheme of this second embodiment, the phase encoding gradient magnetic field Ge 53 is applied at a rate of once in every two switchings of the reading gradient magnetic field Gr 51 as described above, and then the subsequently acquired echo signals 58 are separately stored as separate data set for the image re-construction, as in the data set 55 for the even turns and the data set 56 for the odd turns shown in FIG. 20. Then, each of these data sets 55 and 56 is used to re-construct one image independently. Here, in order to make the direction of the reading gradient magnetic field in the re-constructed images to be oriented identically, one of these data sets 55 and 56 are inverted along the direction of the reading gradient magnetic field Gr.

In this manner, in this second embodiment, it is possible to obtain two re-constructed MR images without the N/2 artifact from the data sets 55 and 56 as these data sets 55 and 56 have no discontinuity in their respective K-spaces. Here, it is possible to re-construct one image from each of the data sets 55 and 56 as the phase encoding gradient magnetic field Ge 52 is applied at a rate of once in every two switchings of the reading gradient magnetic field Gr 51 so as to apply all the encoding steps on both of the odd and even turns identically.

It is to be noted, however, that there is a drawback in this modified division scan scheme in that the imaging time required for obtaining the same resolution is going to be twice as long as that in the conventional division scan scheme, as the rate of applying the phase encoding gradient magnetic field Ge is reduced to once in every two switchings of the reading gradient magnetic field Gr. However, this drawback is not going to be a serious problem in practice for the following reason.

Namely, in the division scan scheme and the ultra high speed imaging scheme, as a trade off for the advantage of the short imaging time, the S/N ratio is going to be lowered compared with the usual imaging schemes, because of the limitations on the hardware. Consequently, at present, the improvement of the S/N ratio is usually achieved by repeating the imaging operation several times, and taking an average of the sum of the resulting images. However, the images obtained by the conventional division scan scheme contain the N/2 artifact as described above, so that even when the S/N ratio is improved by this averaging procedure, a complicated correction procedure based on the static magnetic field distribution measurement is required in other to remove the N/2 artifact, and such a complicated correction procedure requires a considerable amount of time.

In contrast, the modified division scan scheme of this second embodiment can obtain two images without the N/2 artifact by each imaging operation, and the image with the improved S/N ratio can be obtained by simply taking an average of the sum of these two images, while the further improvement of the S/N ratio to the same level as the conventional division scan scheme can be realized by the above noted averaging procedure, without requiring a considerably time consuming correction procedure. Thus, the extra imaging time required by this modified division scan scheme can be compensated by the time saved by not carrying out the correction procedure, and the images of the same resolution level can be obtained in this modified division scan scheme by roughly the same amount of time as in the conventional division scan scheme.

Now, in a case a moving object such as the blood is present in the imaging region, the modified division scan scheme of this second embodiment can obtain two reconstructed MR images from the separate data sets obtained by the odd turns and the even turns, just like as already described above.

Figure 21:
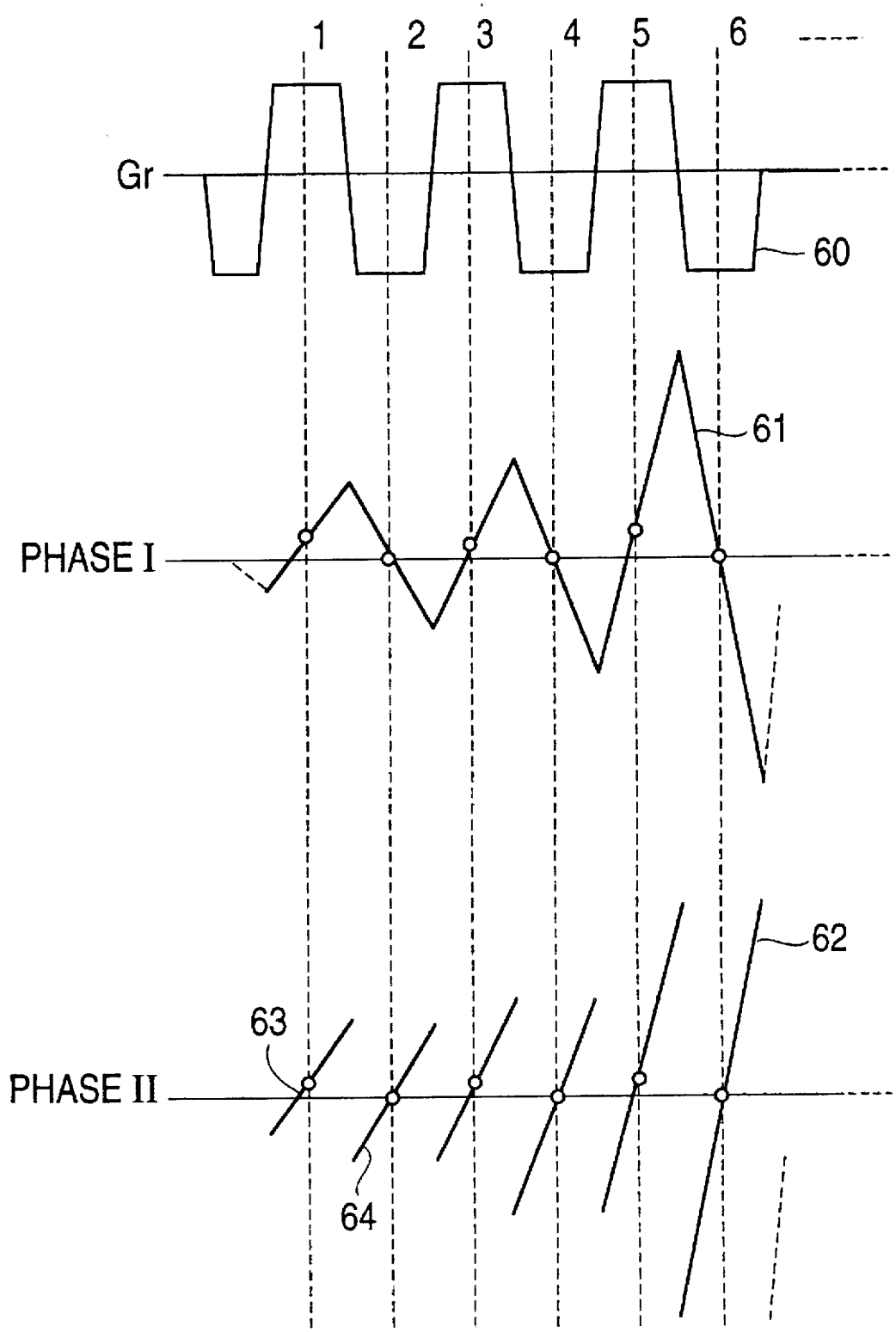
FIG. 21 is a timing chart showing the phase shift in the modified division scan scheme of FIG. 18 in a case of imaging a moving object.

In this case, the phase shift due to the influence of the blood motion appears as shown in FIG. 21 where, in relation to the reading gradient magnetic field Gr 60 which is switching at high speed, the phases of the echo signals shift in time as indicated as PHASE I 61, and when the the echo signals for the even turns are inverted in time in order to make the direction of the reading gradient magnetic field in the re-constructed images to be oriented identically, the phases of the data sets are as indicated as PHASE II 62. As can be seen in FIG. 21, the phase 64 for the echo peak of the even turn is cancelled out to be exactly zero, but the phase 63 for the echo peak of the odd turn is not zero and has the phase shift expressed by following equation (5):

$$\Delta\phi=\tfrac{1}{4}\cdot v\cdot\tau^2 \quad (5)$$

where v is the speed of the blood and τ is a half period of the reading gradient magnetic field switching.

Thus, by re-constructing the image from the data set for the even turns alone, it is possible to obtain the re-constructed MR image in which the influence of the blood motion in the direction of the reading gradient magnetic field is suppressed, which is very difficult to obtain conventionally.

On the other hand, when the image is re-constructed from the data set for the odd turns alone, the image reflecting the phase shift due to the influence of the blood motion can be obtained. In this second embodiment, the difference between the complex image data or the raw data of these data sets for the odd and even turns is obtained and information concerning the speed component and the amplitude component at each pixel is deduced from the difference, such that the image indicating the blood flow speed distribution and the image indicating a passage of the blood flow, i.e., the blood vessel, can be obtained. Namely, the difference between the data sets for the odd and even turns in terms of the pixel amplitude values can reflect the reduction of the total magnetization vector component at each pixel due to the presence of the flow, so that it is possible indicate the passage of the flow by simply presenting this difference in terms of the pixel amplitude values as an image. On the other hand, the difference between the data sets for the odd and even turns in terms of the phases can reflect the flow speed as can be seen from the above equation (5), so that it is possible to indicate the speed distribution of the flow by presenting the differences in terms of the phases as an image.

Thus, in this second embodiment, it also becomes possible to realize the imaging of the blood vessel or the blood flow in the reading gradient magnetic field direction, without requiring an addition of an extra gradient magnetic field such as that for the flow encoding pulses which is conventionally required.

It is also possible to additionally use the extra gradient magnetic field such as that for the flow encoding pulse to change the sensible blood flow speed or direction that can be imaged.

It is also possible to realize the imaging of the two-dimensional, or three-dimensional blood flow by carrying out the imaging operations with the direction of the reading gradient magnetic field set in two orthogonal directions within the slice plane, or in three orthogonal directions including the normal direction of the slice plane in addition to the two orthogonal directions within the slice plane.

It is to be noted here that the roles of the odd and even turns described above can easily be exchanged by the addition of an appropriate pre-pulse.

It is also to be noted that, in a case of using the above noted averaging procedure in this case of imaging the moving object, the averaging procedure should be applied after the influence due to the motion is reduced by taking the absolute values of the acquired data.

Figure 20:
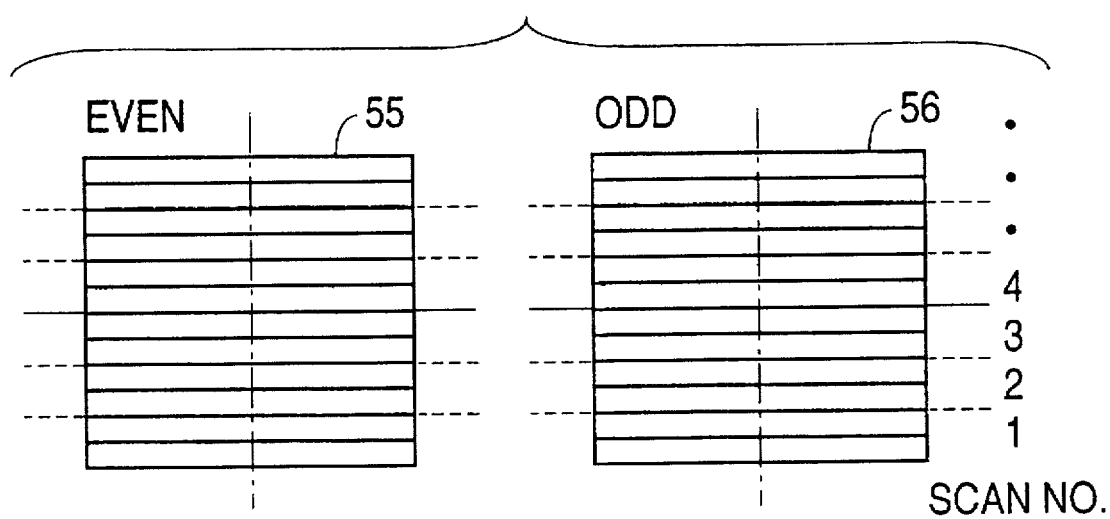
FIG. 20 is diagrammatic illustration of two data sets for odd and even turns obtained by the modified division scan scheme of FIG. 18.
Figure 22A:
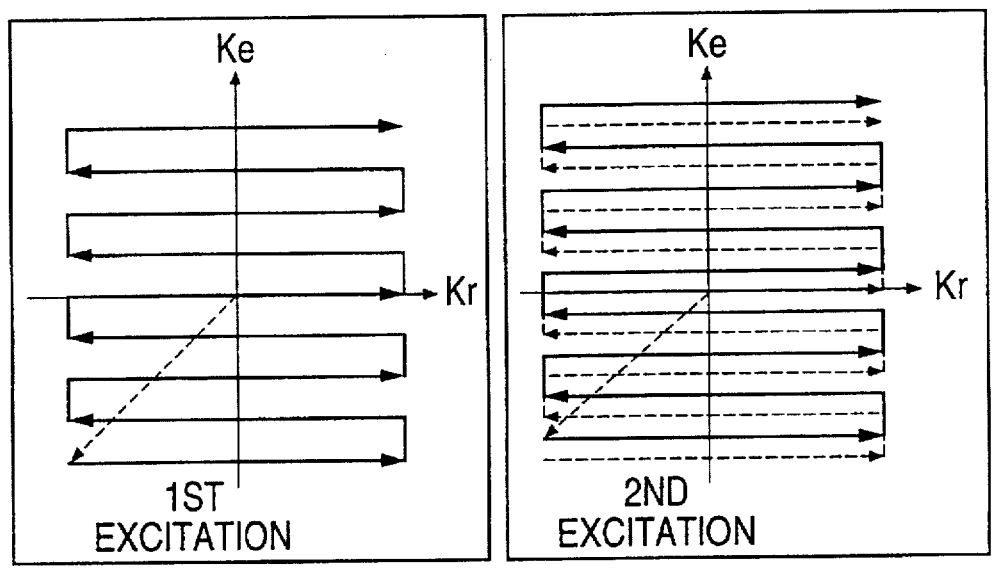
FIGS. 22A and 22B are K-space diagrams for an interlace scanning pattern and a timing chart for the pulse sequence of the simple division scheme that can be adapted to the modified division scan scheme of the second embodiment.
Figure 22B:
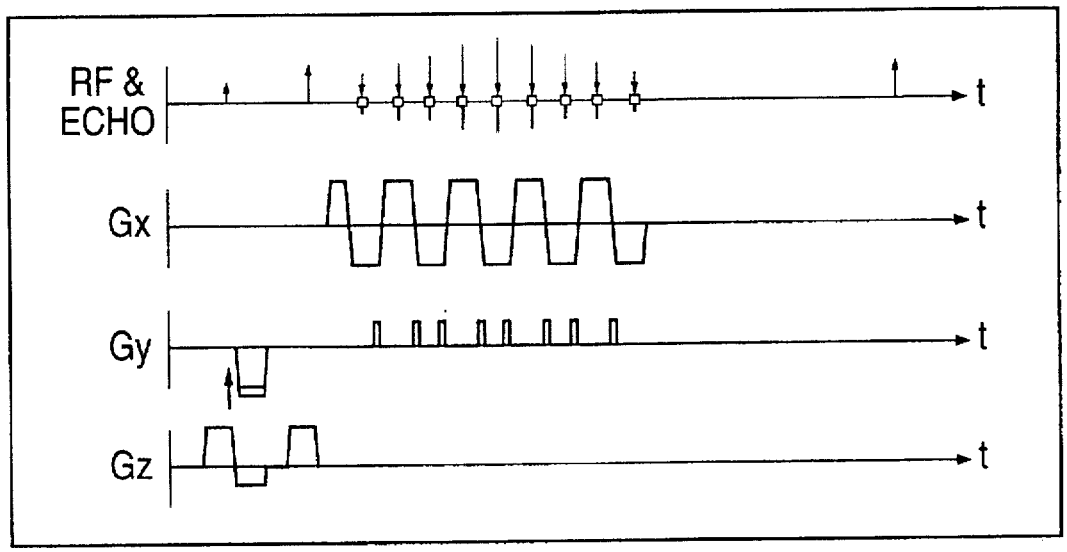
Figure 23A:
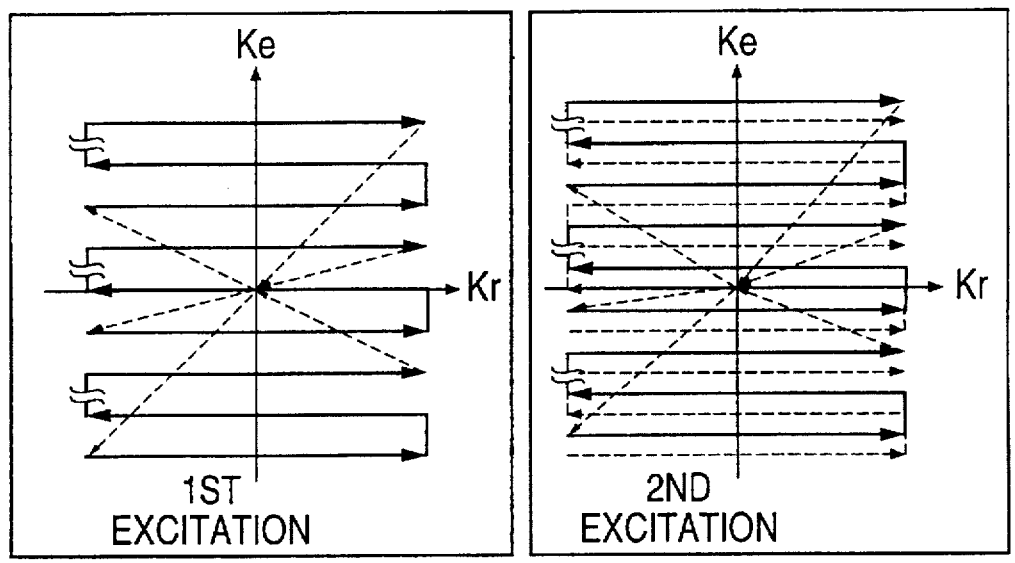
FIGS. 23A and 23B are K-space diagrams for an interlace scanning pattern and a timing chart for the pulse sequence of the CPMG hybrid scheme that can be adapted to the modified division scan scheme of the second embodiment.
Figure 23B:
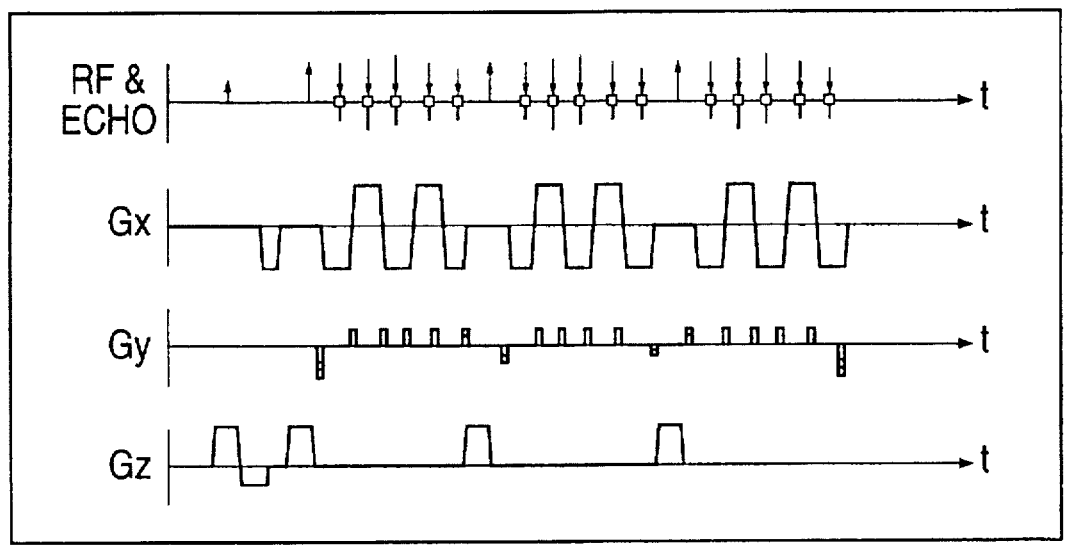

In the modified division scan scheme of this second embodiment described above, the scanning order on the K-space may be different from that of the block-wise scanning pattern as in FIG. 20, and can be that of the interlace scanning pattern, or that of a combination of these. For example, in a case of using the simple division scheme in which the pulse sequence for the ultra high speed imaging scheme as shown in FIG. 22B is simply repeated, the interlace scanning pattern on the K-space appears as shown in FIG. 22A, whereas in a case of using the CPMG hybrid scheme with 3 spin echoes and 5 gradient echoes in which the spin echo imaging scheme with 180° pulses is used in combination as in the pulse sequence shown in FIG. 23B, the interlace scanning pattern on the K-space appears as shown in FIG. 23A. Here, these interlace scanning patterns of FIGS. 22A and 23A are depicted for the conventional division scan scheme, but they can be adapted to the modified division scan scheme of this second embodiment by omitting one encoding step in every two encoding steps and separating the echo signals to those for the odd turns and those for the even turns.

It is to be noted here that, in a case of the interlace scanning pattern, the discontinuity of the data on the K-space is not going to be arranged at one line in every two lines as in the case of the block-wise scanning described above, so that the artifact to be suppressed is not the N/2 artifact but that in which the host appears at closer intervals.

In addition, in the modified division scan scheme of this second embodiment, the faster imaging operation can be realized by shortening the repetition time TR by utilizing the FID signals resulting from the low flip angle excitation pulses as the RF excitation pulses other than the 90° and 180° excitation pulses used in obtaining the echo signals in the spin echo scheme.

Furthermore, in the modified division scan scheme of this second embodiment, the water and fat components can be separated as follows.

Figure 24A:
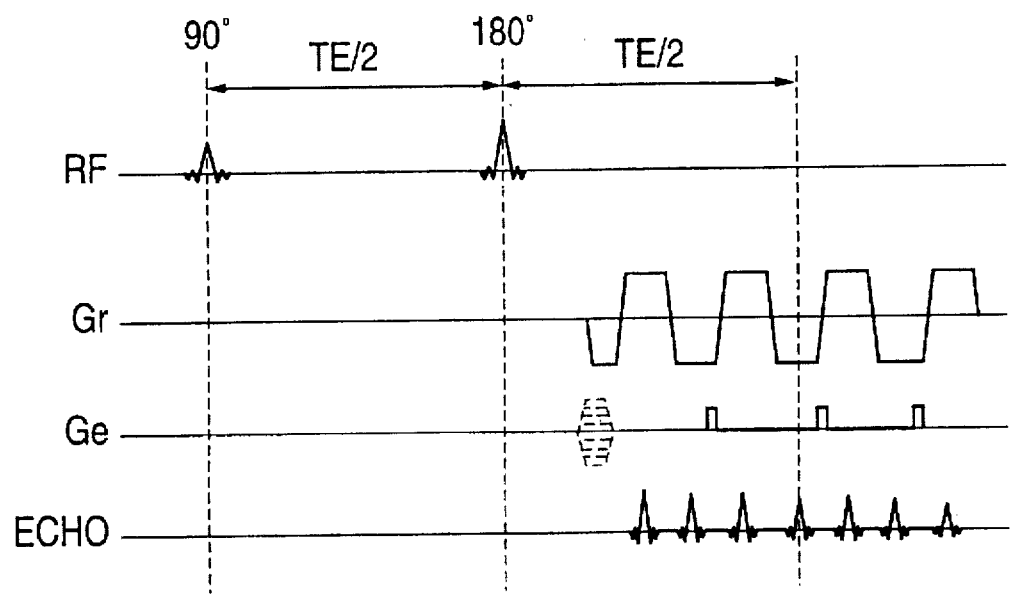
FIGS. 24A and 24B are timing charts for two pulse sequences to be used in one method for obtaining separated images for the water and fat in the modified division scan scheme of the second embodiment.
Figure 24B:
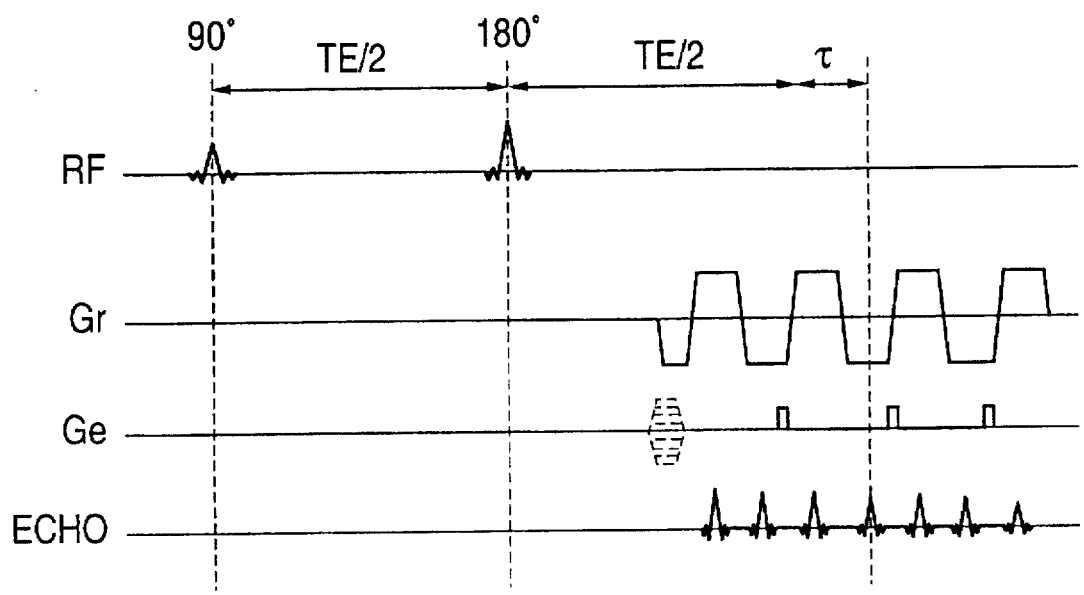
Figure 25A:
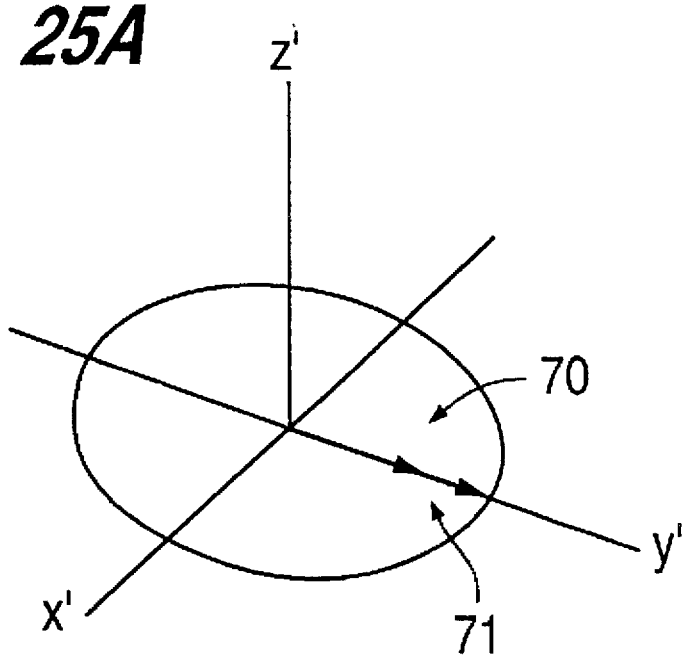
FIGS. 25A and 25B are diagrammatic illustrations of two states of the phases of the echo signals for the water and fat for which the data are to be acquired in one method for obtaining separated images for the water and fat in the modified division scan scheme of the second embodiment.
Figure 25B:
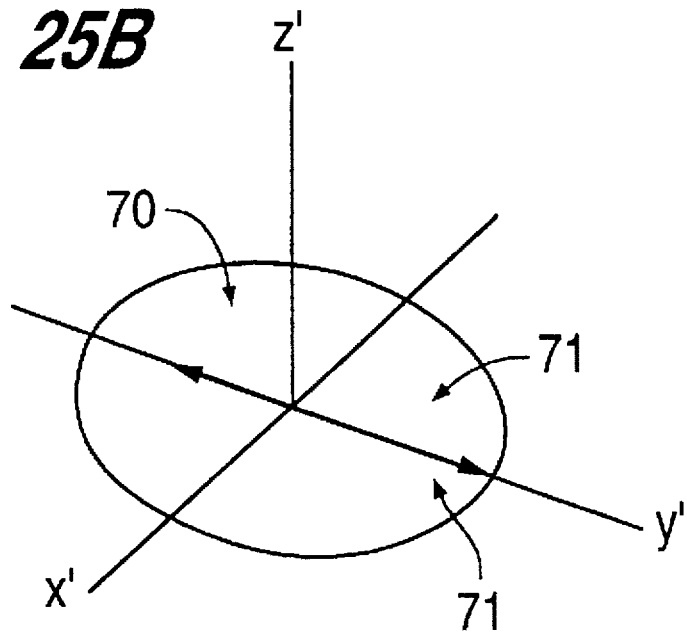

Namely, two imaging operations using two pulse sequences shown in FIGS. 24A and 24B in which the period between the RF excitation and the data acquisition is changed by a prescribed period τ are executed in such a manner that one of these imaging operations obtains the data for a state shown in FIG. 25A in which the phase of the zero encoding echo signal 70 for the fat and the phase of the zero encoding echo signal 71 for the water coincide with each other, and another one of these imaging operations obtains the data for a state shown in FIG. 25B in which the phase of the zero encoding echo signal 70 for the fat and the phase of the zero encoding echo signal 71 for the water are opposite to each other.

Then, by adding and subtracting the image data or the raw data of the images obtained by these two pulse sequences of FIGS. 24A and 24B, the separated images for the water and fat components can be obtained. Namely, let the water image be W and the fat image be F, then the image obtained by one of these two pulse sequences realizing the state of FIG. 25A is going to be W+F, while the image obtained by another one of these two pulse sequences realizing the state of FIG. 25B is going to be W−F. Thus, when the sum of these W+F and W−F is divided by two, the water image W can be obtained, whereas when the difference between these W+F and W−F is divided by two, the fat image F can be obtained.

Alternatively, by executing the imaging operation by adjusting the switching interval of the reading gradient magnetic field in such a manner to obtain the data in a state in which the phases of the zero encoding echo signals for the water and fat are different by 90°, the water image data can be obtained along the real axis in the complex image data, while the fat image data can be obtained along the imaginary axis in the complex image data, so that the separated images for the water and fat components can be obtained by only one imaging operation.

It is to be noted that these methods for obtaining the separated images for the water and fat are not just applicable to the modified division scan scheme of this second embodiment but also to the conventional division scan scheme as well, as long as the inhomogeneity of the static magnetic field is sufficiently small with respect to the reading gradient magnetic field strength such that the N/2 artifact is ignorably small.

Figure 26:
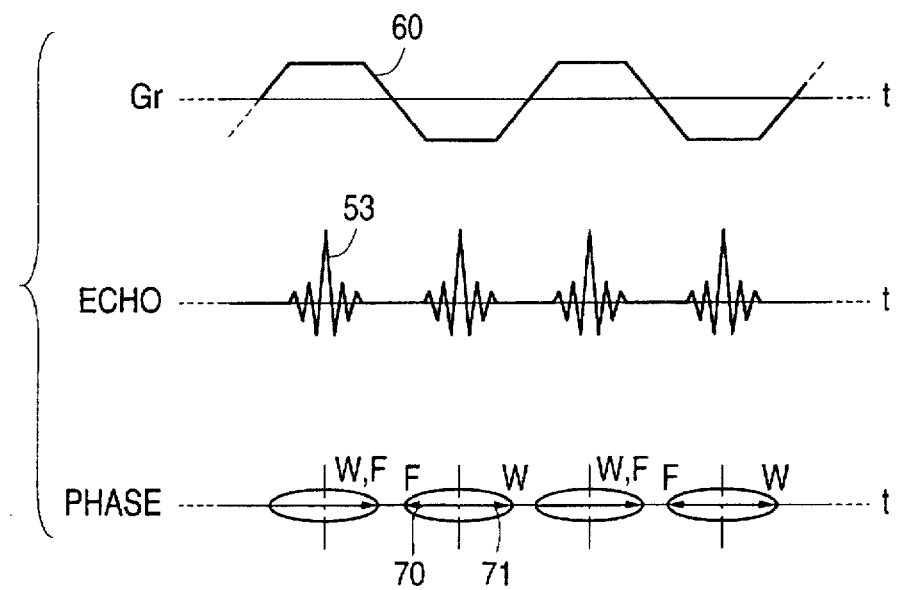
FIG. 26 is a timing chart for another method for obtaining separated images for the water and fat in the modified division scan scheme of the second embodiment.

On the other hand, it is also possible to adjust the switching interval between the adjacent odd turn and even turn of the reading gradient magnetic field such that the phases of the zero encoding echo signals for the water and fat coincide with each other at the odd (or even) turns while they are opposite to each other at the even (or odd) turns as shown in FIG. 26, the separated images for the water and fat can be obtained from the two data sets for the odd and even turns representing W+F and W−F, by only one imaging operation according to the modified division scan scheme of this second embodiment.

Moreover, instead of separating the water and fat images, it is also possible to suppress the chemical artifact due to the position displacement of the fat component by adjusting the switching interval of the reading gradient magnetic field as follows.

Figure 27:
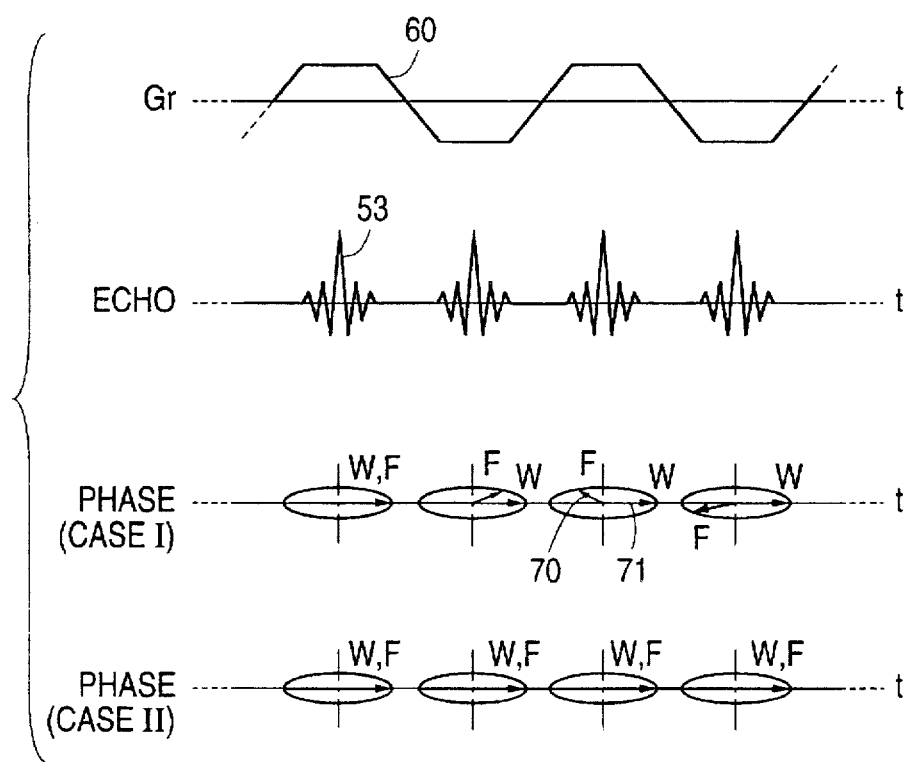
FIG. 27 is a timing chart for a method for suppressing the chemical shift in the modified division scan scheme of the second embodiment.

Namely, the resonant frequency of the proton in fat appears at approximately 3.5 ppm which is on a somewhat slower side compared with that of the proton in the water, and therefore the phases of the zero encoding echo signals for the water and fat are going to be dispersed as the time elapses even when they have the coinciding phase at the beginning, as indicated as PHASE (CASE I) in FIG. 27. Consequently, when the image is re-constructed from these echo signals as the image data, the position of the fat component is going to be displaced to give rise to the chemical artifact.

In order to suppress this chemical artifact, the switching interval of the reading gradient magnetic field as well as the associated parameters such as the data acquisition time and the rise time of the reading gradient magnetic field, etc. can be set up such that the echo signal interval becomes equal to the period of the phase difference between the magnetization vectors (or the zero encoding echo signal) for the water and fat, or an integer multiple of this period.

For example, let the resonant frequency of the water be $f_w$, the resonant frequency of the fat be $f_F$, and the frequency difference $\Delta f$ be defined as $\Delta f = f_W - f_F$. Then, the phase difference $\Delta\theta$ at a time t is expressed by the following equation (6):

$$\Delta\theta = 2\pi \cdot \Delta f \cdot t \qquad (6)$$

so that the switching lateral of the reading gradient magnetic field can be set such that the the echo signal interval $\tau$ takes the value given by the following equation (7):

$$\tau = (1/\Delta f) \cdot N \qquad (7)$$

where N is any desired integer greater than zero.

In this manner, the phases of the magnetization vectors for the water and fat can be aligned with each other at a timing of each echo peak as indicated as PHASE (CASE II) in FIG. 27. Consequently, when the image is re-constructed from these echo signals as the image data, the position of the fat component is not going to be displaced on the re-constructed image as there is no phase difference between the magnetization vectors for the water and fat, and therefore the chemical artifact can be suppressed.

As described, according to this second embodiment, it is possible to provide a nuclear magnetic resonance imaging scheme capable of obtaining the MR images at high image quality by protecting the image quality against the N/2 and chemical artifacts, without requiring a complicated procedure. In addition, according to this second embodiment, it also becomes possible to realize the imaging of the blood vessel or the blood flow in the reading gradient magnetic field direction free of the artifact due to the blood motion.

It is to be noted here that, besides those already mentioned above, many modification and variations of the above embodiments may be made without departing from the novel and advantageous features of the present invention. Accordingly, all such modifications and variations are intended to be included within the scope of the appended claims.

What is claimed is:

1. A method of nuclear magnetic resonance imaging, comprising the steps of:

exciting spins in an imagine region within the patient placed in a static magnetic field by applying prescribed gradient magnetic fields and RF pulses onto the patient:

applying a reading gradient magnetic field which is repeatedly switching its polarity, along a phase encoding gradient magnetic field applied at a rate of once in every two switchings of the reading gradient magnetic field;

acquiring NMR signals from the patient resulting from the reading gradient magnetic field applied at the applying step, and separating the NMR signals resulting from odd and even turns of switchings of the reading gradient magnetic field as data set for odd turns and data set for even turns; and re-constructing one MR image from the data see for odd turns alone, and another MR image from the data set for even turns alone.

2. The method of claim 1, wherein one of the data set for odd turns and the data set for even turns is inverted along a direction of the reading gradient magnetic field on K space.

3. The method of claim 1, further comprising the step of taking an average of a sum of said one MR image and said another MR image.

4. The method of claim 1, wherein the imaging region contains a moving object at the exciting step, and further comprising the step of outputting said another MR image re-constructed from the data set for even turns alone as an image of the imaging region without an artifact due to a motion of the moving object in a direction of the reading gradient magnetic field.

5. The method of claim 4, further comprising the step of taking a difference between said one MR image and said another MR image, and obtaining an image indicating a moving speed distribution of the moving object and an image indicating a passage for a moving object according to the difference.

6. The method of claim 1, wherein the RF pulses includes low flip angle excitation pulses at the exciting step, and the NMR signals includes FID signals resulting from the low flip angle excitation pulses at the acquiring step.

7. The method of claim 1, wherein the imaging region contains water and fat at the exciting step, the NMR signals acquired at the acquiring steps are echo signals, and the method further comprising the steps of:

executing two imaging operations, each of which carries out the exciting step, the applying step, the acquiring step, and the re-constructing step, by using two pulse sequences in which a period between the exciting step and the applying step is changed such that one of the imaging operations obtains data for a state in which polarities of zero encoding echo signals for the water and the fat coincide with each other, and another one of the imaging operations obtains data for a state in which the polarities of the zero encoding echo signals for the water and fat are opposite to each other; and obtaining separated images for the water and fat from images re-constructed from the data obtained by said two imaging operations.

8. The method of claim 1, wherein the imaging region contains water and fat at the exciting step, the NMR signals acquired at the acquiring steps are echo signals, and the method further comprising the steps of:

adjusting a switching interval of the reading gradient magnetic field applied at the applying step so as to acquire the echo signals at the acquiring step in a state in which phases of zero encoding echo signals for the water the fat are different by 90°; and obtaining separated images for the water and fat from an image re-constructed at the re-constructing step from the echo signals obtained by using the switching interval adjusted by the adjusting step.

9. The method of claim 1, wherein the imaging region contains water and fat at the exciting step, the NMR signals acquired at the acquiring steps are echo signals, and the method further comprising the steps of:

adjusting a switching interval of the reading gradient magnetic field applied at the applying step so as to acquire the echo signals at the acquiring step in a state in which phases of zero encoding echo signals for the water and the fat coincide with each other as one of the data set for odd turns and the data set for even turns, and the echo signals in a state in which the phases of the zero encoding echo signals for the water and fat are opposite to each other as another one of the data set for odd turns and the data set for even turns; and obtaining separated images for the water and fat from the MR images re-constructed at the re-constructing step from the data set for odd turns and the data set for even turns based on the echo signals obtained by using the switching interval adjusted by the adjusting step.

10. The method of claim 1, wherein the imaging region contains water and fat at the exciting step, the NMR signals acquired at the acquiring steps are echo signals, and the method further comprising the steps of:

adjusting a switching interval of the reading gradient magnetic field applied at the applying step such that the echo signals are acquired at the acquiring step at an interval which coincides with an N multiple of a period of phase difference between magnetization vectors for the water and fat, where N is an integer greater than zero; and outputting the MR images re-constructed at the re-constructing step from the echo signals obtained by using the switching interval adjusted by the adjusting step as an image of the imaging region without a chemical artifact.

* * * * *